(12) United States Patent
Rajendran et al.

(10) Patent No.: US 7,902,051 B2
(45) Date of Patent: Mar. 8, 2011

(54) METHOD FOR FABRICATION OF SINGLE CRYSTAL DIODES FOR RESISTIVE MEMORIES

(75) Inventors: Bipin Rajendran, White Plains, NY (US); Thomas Happ, Tarrytown, NY (US); Hsiang-Lan Lung, Elmsford, NY (US)

(73) Assignees: International Business Machines Corporation, Armonk, NY (US); Qimonda AG, Munich (DE); Macronix International Co., Ltd., Hsinchu (TW)

( * ) Notice: Subject to any disclaimer, the term of this patent is extended or adjusted under 35 U.S.C. 154(b) by 65 days.

(21) Appl. No.: 11/970,100

(22) Filed: Jan. 7, 2008

(65) Prior Publication Data

US 2009/0176354 A1 Jul. 9, 2009

(51) Int. Cl.
- *H01L 21/20* (2006.01)
- *H01L 21/36* (2006.01)
- *H01L 21/331* (2006.01)
- *H01L 21/00* (2006.01)

(52) U.S. Cl. ......... 438/487; 438/365; 438/366; 438/367; 438/368; 438/377; 438/482; 438/486; 438/495; 438/517; 257/44; 257/46; 257/104; 257/544; 257/653; 257/E31.077; 257/E31.09; 257/E27.069; 257/E29.09; 257/E29.196

(58) Field of Classification Search .......... 438/365–368, 438/377, 482, 487, 495, 486, 517, 414, 420, 438/356; 257/4, 44, 46, 96, 104, 544, 653–654, E31.077, E31.09, E27.069, E29.019, E29.057, E29.059, E29.196, E29.329

See application file for complete search history.

(56) References Cited

U.S. PATENT DOCUMENTS

| | | | | |
|---|---|---|---|---|
| 4,764,799 A * | 8/1988 | Malaviya | ...................... | 257/514 |
| 5,751,017 A * | 5/1998 | Jang et al. | ...................... | 257/57 |
| 6,551,885 B1 * | 4/2003 | Yu | ................... | 438/300 |
| 2006/0186483 A1 * | 8/2006 | Cho et al. | ...................... | 257/390 |
| 2006/0237756 A1 * | 10/2006 | Park et al. | ...................... | 257/296 |
| 2006/0275962 A1 * | 12/2006 | Lee | ................... | 438/152 |
| 2007/0018192 A1 * | 1/2007 | Salzman et al. | ............. | 257/103 |
| 2007/0035027 A1 * | 2/2007 | Gonzalez et al. | ............ | 257/758 |
| 2007/0235074 A1 * | 10/2007 | Henley et al. | ................ | 136/252 |
| 2008/0078984 A1 * | 4/2008 | Park et al. | ......................... | 257/4 |
| 2008/0210922 A1 * | 9/2008 | Lee et al. | .......................... | 257/3 |
| 2009/0200534 A1 * | 8/2009 | Rajendran et al. | ................ | 257/3 |

* cited by examiner

*Primary Examiner* — Zandra Smith
*Assistant Examiner* — Jeremy J Joy
(74) *Attorney, Agent, or Firm* — Scully, Scott, Murphy & Presser, P.C.; Vazken Alexanian

(57) ABSTRACT

The present invention, in one embodiment, provides a method of producing a PN junction the method including providing a single crystal substrate; forming an insulating layer on the single crystal substrate; forming a via through the insulating layer to provide an exposed portion of the single crystal substrate; forming amorphous Si on at least the exposed portion of the single crystal substrate; converting at least a portion of the amorphous Si into single crystal Si; and forming dopant regions in the single crystal Si. In one embodiment the diode of the present invention is integrated with a memory device.

14 Claims, 3 Drawing Sheets

METHOD FOR FABRICATION OF SINGLE CRYSTAL DIODES FOR RESISTIVE MEMORIES

FIELD OF THE INVENTION

In one embodiment, the present invention relates to microelectronics. More particularly, the present invention relates to diodes and memory devices.

BACKGROUND OF THE INVENTION

One property of a PN diode is that it conducts an electric current in one direction and blocks it in the other. This behavior arises from the electrical characteristics of a junction, called a PN junction fabricated within a semiconductor crystal. When P-type and N-type materials are placed in contact with each other, the junction behaves differently than either type of material alone. Current will flow readily in one direction (forward biased) but not in the other (reverse biased), creating the basic diode. This non-reversing behavior arises from the nature of the charge transport process in the two types of materials. PN diodes are used in a number of microelectronic devices including, but not limited to: transistors, field effect transistors, and memory devices.

SUMMARY OF THE INVENTION

The present invention, in one aspect provides a method of forming a PN junction in a single crystal Si material. In one embodiment, the inventive method includes:
providing a single crystal substrate;
forming an insulating layer on the single crystal substrate;
forming a via through the insulating layer to provide an exposed portion of the single crystal substrate;
forming an amorphous material on at least the exposed portion of the single crystal substrate;
converting at least a portion of the amorphous material into a single crystal material; and
forming a first dopant region and a second dopant region in the single crystal material, wherein the first dopant region is positioned abutting the second dopant region.

In one embodiment, the amorphous material may comprise Si, SiC, SiGe, SiGeC, Si alloys, Ge, Ge alloys, GaAs, InAs, InP as well as other III/V and II/VI compound semiconductors. In one embodiment, the single crystal material may comprise Si, SiC, SiGe, SiGeC, Si alloys, Ge, Ge alloys, GaAs, InAs, InP as well as other III/V and II/VI compound semiconductors.

In one embodiment, the amorphous material is composed of an amorphous Si-containing material. In one embodiment, the amorphous Si-containing material comprises amorphous Si or amorphous SiGe. In one embodiment, the single crystal material is a single crystal Si-containing material. In one embodiment, the single crystal Si-containing material comprises single crystal Si or single crystal SiGe. In one embodiment, the single crystal substrate has a crystalline orientation that may be <100>, <111>, or <110>.

In one embodiment of the inventive method of forming a PN junction, the step of converting the amorphous material into singe crystal material includes laser annealing or electron beam annealing. In one embodiment, laser annealing or electron beam annealing of the amorphous material includes a single energy pulse or a series of energy pulses, wherein each energy pulse is from about 10 nano-seconds (ns) to about 50 nano-seconds (ns) in duration. In one embodiment, the step of converting the amorphous material into the single crystal material includes increasing the temperature of the amorphous material to greater than the melting temperature of the amorphous material. In another embodiment, the conversion of the amorphous material into single crystal material includes increasing the temperature of the amorphous material to greater than the melting temperature of the amorphous material and less than a melting temperature of the single crystal substrate.

In one embodiment, the single crystal material has the same crystalline orientation as the single crystal substrate. In one embodiment, the crystalline orientation of the single crystal material may be <100>, <111>, or <110>.

In another aspect of the present invention, a method of forming a memory device is provided. In one embodiment, the method of producing a memory device includes:
providing a single crystal substrate;
forming an amorphous Si-containing material on at least a portion of the singe crystal substrate;
converting at least a portion of the amorphous Si-containing material into a single crystal Si-containing material;
providing a PN junction in the single crystal Si-containing material; and
forming a memory cell in contact with the PN junction.

In one embodiment of the method of forming a memory device, the amorphous Si-containing material comprises amorphous Si or amorphous SiGe. In one embodiment, the single crystal Si-containing material comprises single crystal Si or single crystal SiGe. In one embodiment, the single crystal substrate has a crystalline orientation that may be <100>, <111>, or <110>.

In one embodiment of the inventive method of forming a memory device, the step of converting the amorphous Si-containing material into single crystal Si-containing material includes laser annealing or electron beam annealing. In one embodiment, laser annealing or electron beam annealing of the amorphous Si-containing material includes a single energy pulse or a series of energy pulses, wherein each energy pulse is from about 10 nano-seconds (ns) to about 50 nano-seconds (ns) in duration. In one embodiment, the step of converting the amorphous Si-containing material into the single crystal Si-containing material includes increasing the temperature of the amorphous Si-containing material to greater than the melting temperature of the amorphous Si-containing material. In another embodiment, the conversion of the amorphous Si-containing material into single crystal Si-containing material includes increasing the temperature of the amorphous Si-containing material to greater than the melting temperature of the amorphous Si-containing material and less than a melting temperature of the single crystal substrate. In a further embodiment, the conversion of the amorphous Si-containing material into single crystal Si-containing material includes increasing the temperature of the amorphous Si-containing material to greater than about 1150° C. and less than about 1350° C.

In one embodiment, the single Si-containing material has the same crystalline orientation as the single crystal substrate. In one embodiment, the crystalline orientation of the single crystal Si-containing material may be <100>, <111>, or <110>.

In one embodiment of the method for forming a memory device, the step of forming a memory cell in contact with the PN junction includes forming a silicide contact on a dopant region of the PN junction; forming an electrode atop the silicide contact; and forming a phase change memory material atop the electrode.

In another aspect, the present invention provides a memory device including a phase change material and a single crystal diode. In one embodiment, the memory device includes
a phase change material;
a single crystal diode in electrical contact with the phase change material; and
a semiconductor substrate in contact with the single crystal diode, wherein the semiconductor substrate and the single crystal diode have the same crystalline orientation.

In one embodiment, the single crystal diode is composed of a single crystal Si-containing material having a crystalline orientation of <100>, <111>, or <110>. In one embodiment, the single crystal diode comprises a first dopant region and a second dopant region, wherein the electrical conductivity of the first dopant region is different that the second dopant region. In one embodiment, the first dopant region is formed abutting the second dopant region along a vertical axis of the single crystal diode.

BRIEF DESCRIPTION OF THE DRAWINGS

The following detailed description, given byway of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
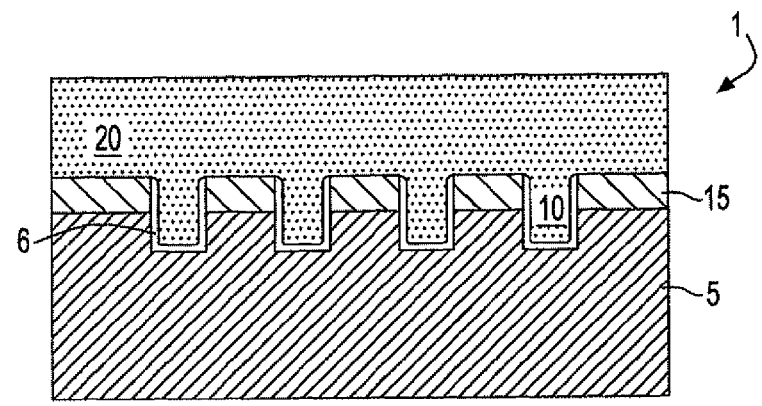
FIG. 1 is a cross sectional side view of one embodiment of an initial structure including a substrate, an insulating layer atop the substrate and isolation regions extending into the substrate, as used in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for producing a PN junction in single crystal Si. When describing the inventive method and structures, the following terms have the following meanings, unless otherwise indicated.

As used herein, "PN junction" refers to a junction that is formed by combining N-type and P-type semiconductors. The term junction refers to the interface where the two types of semiconductors meet.

As used herein, a "P-type semiconductor" refers to the addition of trivalent impurities such as boron, aluminum or gallium to an intrinsic Si substrate that creates deficiencies of valence electrons.

As used herein, an "N-type semiconductor" refers to the addition of pentavalent impurities such as antimony, arsenic or phosphorous that contributes free electrons to an intrinsic Si substrate.

As used herein, the term "amorphous " denotes a non-crystalline solid.

As used herein, the term "amorphous Si" (α-Si) denotes a non-crystalline form of silicon.

As used herein, the term "amorphous SiGe" (α-Si) denotes a non-crystalline form of SiGe.

As used herein, the term "single crystal" denotes a crystalline solid, in which the crystal lattice of the entire sample is substantially continuous and substantially unbroken to the edges of the sample, with substantially no grain boundaries.

As used herein, the term "single crystal Si" (c-Si) denotes a crystalline solid form of silicon, in which the crystal lattice of the entire sample of the silicon is substantially continuous and substantially unbroken to the edges of the sample, with substantially no grain boundaries.

As used herein, the term "converted single crystal Si" denotes a single crystal Si that is formed from amorphous Si.

As used herein, the term "Si containing substrate" refers to a substrate of a device including at least Si, or a layer formed atop a device substrate, including at least Si. In one embodiment the substrate may comprise SiGe.

As used herein, "dopant regions" refers to a solid-state material in which the electrical conductivity of the region is dependent upon n-type or p-type dopants.

As used herein, "laser annealing" means increasing temperature by Light Amplification by Stimulated Emission of Radiation in which the wavelength ranges from about 248 nm to about 1064 nm, and the application of the pulse energy ranges from about 0.1 nanoseconds to about 100 nano seconds. In one embodiment, intensity of the laser pulse may be between 1 to 100 MW/cm$^2$ As used herein, "electron beam annealing" refers to increasing temperature by irradiation of an electron beam, in which the accelerating potential of beam ranges from about 5 KeV to about 100 KeV, and the application the pulse energy ranges from about 5 nanoseconds to about 100 nano seconds.

The term "melting temperature" means the temperature at which a substance changes from solid to liquid state.

As used herein, the term "memory device" means a structure in which the electrical state thereof can be altered and then retained in the altered state; in this way a bit of information can be stored.

"Volatile memory" means memory in which stored information is lost when power to the memory cell is turned off.

"Non-volatile memory" means memory in which the information stored is maintained after the power supply is turned off.

As used herein, the term "resistive memory device" denotes a device whose effective electrical resistivity can be switched between two or more resistivities (ohms) upon an application of an energy pulse, such as a voltage pulse or current pulse. Pulse time may range from approximately 5 nano-seconds to approximately 100 nano-seconds.

As used herein, a "phase change material" is a material that converts from a first phase to a second phase, upon the application of energy.

The term "phase change material memory device" denotes a memory device including a memory cell composed of a phase change material.

As used herein, the term "electrical communication" means that a first structure or material can conduct electricity to a second structure or material.

The term "direct physical contact" means that a first structure and a second structure are positioned in contact without any intermediary conducting, insulating or semiconducting layer at the interface of the two structures.

As used herein, a "barrier metal" is a material used to chemically isolate semiconductors from metal, and provides an electrical connection between them.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIG. 1 depicts one embodiment of an initial structure that may be used to form a PN junction, in accordance with the present invention. In one embodiment, the initial structure 1 may include a substrate 5, isolation region 10, at least one conductive portion 15 and a first insulating layer 20.

In one embodiment, the substrate 5 may be composed of a single crystal semiconducting material. In one embodiment, the single crystal substrate 5 may be a Si-containing substrate. Illustrative examples of Si containing substrates include, but are not limited to: Si, SiGe, SiC, SiGeC, epi Si/Si, epi Si/SiC, epi Si/SiGe, and preformed silicon-on-insulators (SOIs) or SiGe on insulators (SGOIs) which may include any number of buried insulating (i.e., continuous, non-continuous or a combination of continuous and non-continuous) regions formed therein. In yet another embodiment, the single crystal substrate 5 may be formed of <100> or <110> Si.

In one embodiment, the single crystal substrate 5 may house electrical devices including, but not limited to, memory devices, such as phase change memory devices and resistive memory devices; switching devices including but not limited to transistors, such as field effect transistors; capacitors; and resistors.

In one embodiment, the single crystal substrate 5 may include at least one conductive portion 15, such as a conductive line that may be a word line or bit line. In one embodiment, the conductive line may be a plurality of parallel word lines that when employed with a plurality of bit lines, which extend across the single crystal substrate 5 in a direction substantially perpendicular to the word lines, provides the electrical connection structure of a memory array. In one embodiment, each of the word lines contacts the diode of the memory cell and each of the bit lines contacts the top electrode of the memory cell. In one embodiment in which the substrate 5 is a 300 mm semiconductor wafer, the number of word lines and bit lines are selected to provide connectivity to approximately one million memory cells, hence providing one mega byte. In one embodiment, a conductive portion 15 may be provided by implanting a dopant species, such as an N-type or P-type dopant, into a semiconducting Si-containing substrate. In another embodiment, the conductive portion 15 may be an upper conductive line that is formed from a P-type dopant. In one embodiment, the P-type dopant may be arsenic or phosphorus. In a further embodiment, the conductive portion 15 may be an upper conductive line that is formed from an N-type dopant. In one embodiment, the N-type dopant is boron.

In one embodiment, the isolation region 10 is a trench filled with an insulating material, such as an oxide, nitride, or oxynitride. In one embodiment, the isolation region 10 is positioned separating adjacent conductive portions 15, such as conductive lines, from one another. In one embodiment, the isolation region 10 is a shallow trench isolation (STI) region. In one embodiment, the shallow trench isolation region may be formed by etching a trench in the single crystal substrate 5 utilizing a conventional dry etching process, such as reactive-ion etching (RIB) or plasma etching. In one embodiment, the trench may be etched to a depth greater than the lower surface of the conductive portion 15 in the single crystal substrate 5. The trenches may optionally be lined with a liner material 6, e.g., an oxide. In one embodiment, chemical vapor deposition or another like deposition process may be used to fill the trench with oxide or another like STI dielectric material. The STI dielectric may optionally be densified after deposition. A planarization process, such as chemical-mechanical polishing (CMP), may optionally be used to provide a planar structure, In one embodiment, the first insulating layer 20 is an interlayer dielectric that may include but is not limited to an oxide, nitride or oxynitride material. For the purposes of this following disclosure, the first insulating layer 20 will be referred to as an oxide, but it is noted that other insulating materials may be utilized so long as the material of the first insulating layer 20 allows for etch selectivity during subsequent etch processes. The first insulating layer 20 may be provided by a deposition process, such as chemical vapor deposition, or a growth process, such as oxidation. In one embodiment, the first insulating layer 20 may be used in conjunction with a process flow for forming the isolation regions 10, wherein the first insulating layer 20 may be deposited following the formation of an isolation trench or following the formation of trench sidewall spacers. In one embodiment, the upper surface of the first insulating layer 20 is planarized, wherein the planarization process may be chemical mechanical polishing.

Figure 2:
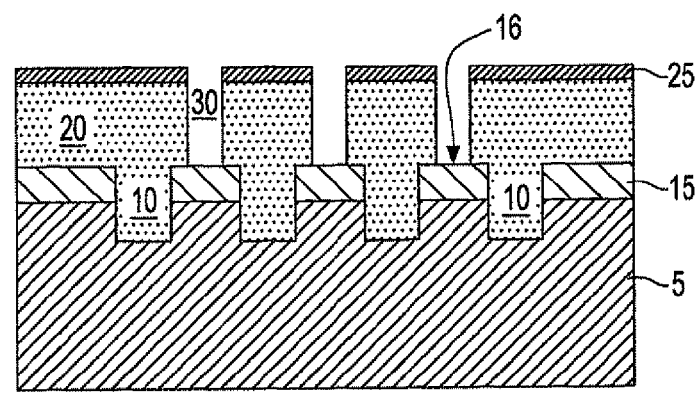
FIG. 2 is a cross sectional side view depicting one embodiment of forming at least one via through the insulating layer to expose a portion of at least one conductive region in the substrate, in accordance with the present invention.

FIG. 2 depicts one embodiment of the formation of a via 30 through the first insulating layer 20 to expose a portion of an upper surface 16 of the conductive line 15 within the single crystal substrate 5. In one embodiment, the formation of the via 30 may begin with the deposition of an second insulating layer 25 atop the first insulating layer 20, wherein the second insulating layer 25 has a composition that may be etched selective to the underlying first insulating layer 20. For example, in embodiments of the present invention when the first insulating layer 20 is an oxide, the second insulating layer 25 may be a nitride. In a following process step, the second insulating layer 25 may be patterned corresponding to the underlying conductive portions 15, wherein the second insulating layer 25 overlying the conductive portions 15 is etched by an anisotropic etch step selective to the first insulating layer 20. In a following step, the etched second insulating layer 25 is utilized as an etch mask, and the first insulating layer 20 is etched selective to portion of the single crystal substrate 5 on which the conductive portion 15 is positioned, wherein this etch step exposes an upper surface 16 of the conductive portion 15. In one embodiment, the formation of the via 30 includes an anisotropic etch step that may be reactive ion etching.

Figure 3:
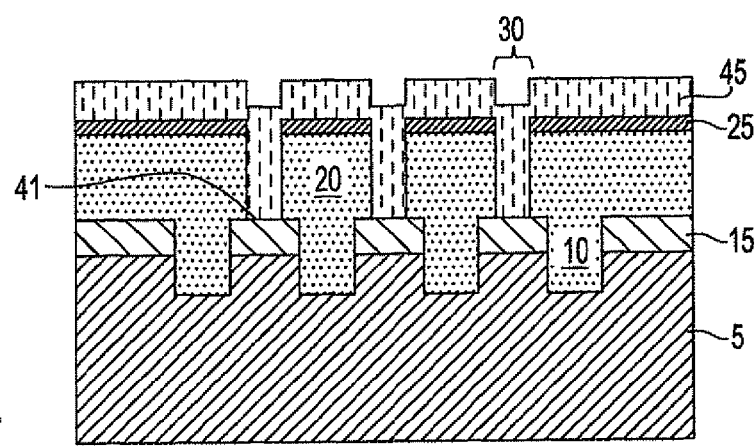
FIG. 3 is a cross sectional side view depicting one embodiment of forming amorphous Si within the via, in accordance with the present invention.

FIG. 3 depicts one embodiment of the deposition of amorphous Si 45 on a conductive portion 15, such as the conductive line, wherein the deposited amorphous Si 45 fills at least a portion of the via 30. The amorphous Si 45 may be formed in direct physical contact with an upper surface 41 of the single crystal substrate 5. In one embodiment, the amorphous Si 45 may be deposited filling the via 30 and extending atop the upper surface of the second insulating layer 25.

Figure 4:
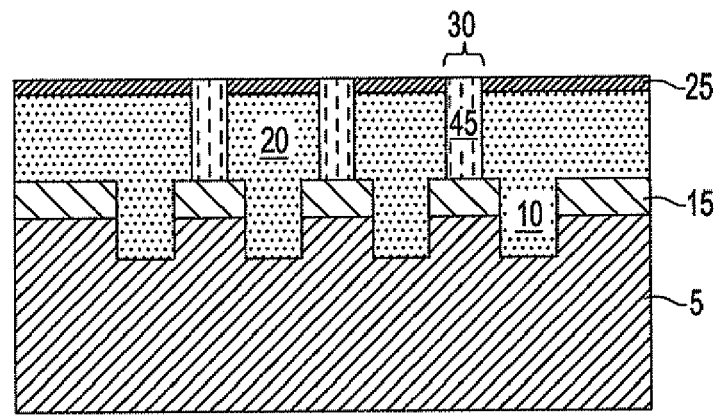
FIG. 4 is a cross sectional side view depicting planarization of the structure depicted in FIG. 3, in accordance with one embodiment of the present invention.

In one embodiment, the layer of amorphous Si 45 may be formed by a deposition step, such as chemical vapor deposition or physical vapor deposition. Examples of chemical vapor deposition include, but are not limited to: Atmospheric Pressure CVD (APCVD), Low Pressure CVD (LPCVD) and Plasma Enhanced CVD (PECVD), Metal-Organic CVD (MOCVD) and combinations thereof. In one embodiment, the amorphous Si 45 may be formed by a chemical vapor deposition in which the deposition temperature is in the range of 300° C. to 500° C. and the silane gas flow rate is in the range of about 0.5 slm to about 2 slm at pressures less than 200 torr. In one embodiment, following deposition of the amorphous Si 45 and prior to the conversion of amorphous Si 45 to single crystal Si 50, the portion of amorphous Si 45 that is not contained within the via 30, such as the amorphous Si extending atop the second insulating layer 25, may be removed by a planarization step, such as CMP, and/or an etch step, as depicted in FIG. 4.

Figure 5:
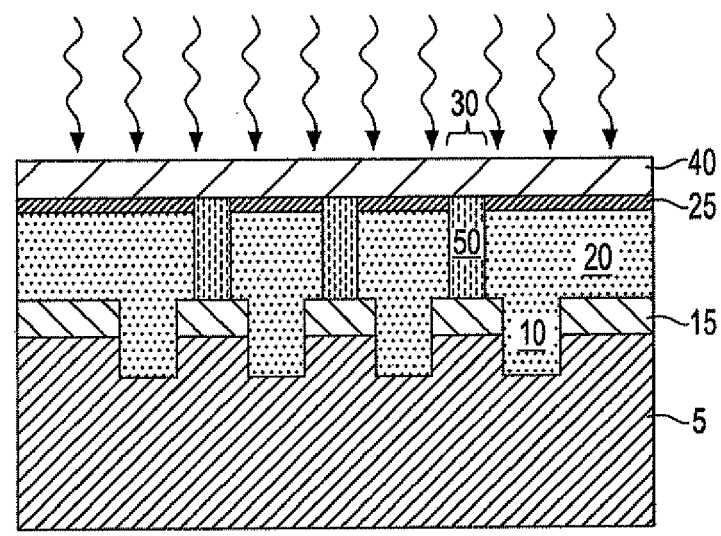
FIG. 5 is a cross sectional view depicting one embodiment of a method step to convert the amorphous Si to single crystal Si, in accordance with the present invention.

FIG. 5 depicts one embodiment of converting at least a portion of amorphous Si 45 within the via 30 to single crystal Si 50. In one embodiment, converting at least a portion of the amorphous Si 45 to single crystal Si 50 includes converting substantially the entire amount of amorphous Si 45 within the via 30 to single crystal Si 50. In one embodiment, prior to the conversion of the amorphous Si 45 to single crystal Si 50, a capping layer 40 is deposited atop at least the upper surface of the vias 30 in which the amorphous Si 45 is contained. In one embodiment, the composition and thickness of the capping layer 40 is selected to provide anti-reflectively during subsequent applications of laser annealing and electron beam annealing in the conversion of the amorphous Si 45 to single crystal Si 50; and that the thickness be sufficient enough to compensate for volumetric expansion of the amorphous Si 45 during conversion to single crystal Si 50. In one embodiment, the capping layer 40 is composed of an oxide. In another embodiment, the capping layer 40 is a nitride, oxynitride, or combination of oxides, nitride and oxynitrides. In one embodiment, the thickness of the capping layer 40 may be from about 5 nm to about 100 nm.

Still referring to FIG. 5, in one embodiment, converting the amorphous Si 45 to single crystal Si 50 includes increasing the temperature of amorphous Si 45 to greater than its melting temperature, wherein following melting the amorphous Si 45 is converted to single crystal Si 50 by recrystallization during solidification. In one embodiment, the amorphous Si 45 is converted to single crystal Si 50 by a heat treatment that induces a low thermal budget on the amorphous Si 45. A low thermal budget process is defined as a heat process with low product of the total temperature excursion in a material and the duration of that excursion. In one embodiment, converting the amorphous Si 45 to single crystal Si 50 includes laser annealing or electron beam annealing. In one embodiment, the laser annealing or electron beam annealing is configured to provide a low thermal budget by operating under a pulsed condition. A pulsed condition means that the energy supplied by the laser annealing or electron beam annealing is delivered in segmented increments of time. In one embodiment, the laser annealing or electron beam annealing may be pulsed for time periods of less than about 1 microsecond. In another embodiment, the laser annealing or electron beam annealing may be pulsed for time periods ranging from about 10 nanoseconds to about 50 nanoseconds. In a further embodiment, the laser annealing or electron beam annealing may be pulsed for time periods ranging from about 20 nanoseconds to about 30 nanoseconds. In one embodiment, the intensity of the laser pulse is in the range of about 1 MW/cm$^2$ to about 10 MW/cm$^2$.

In one embodiment, the amorphous Si 45 is converted to single crystal Si 50 by increasing the temperature of the amorphous Si 45 to greater than about 1150° C. and less than about 1350° C. In one embodiment, the heat treatment provided by laser annealing or electron beam annealing melts the amorphous Si 45 without inducing substantial dopant diffusion in the substrate 5. In another embodiment, the amorphous Si 45 is converted to single crystal Si 50 by increasing the temperature of the amorphous Si 45 to greater than about 400° C. and less than about 700° C.

In one embodiment, the upper surface of the single crystal substrate 5 that is in direct physical contact with the amorphous Si 45 acts as the nucleation seed for single crystal Si 50 growth during recrystallization of the amorphous Si 45 during solidification. The single crystal Si 50 growth begins at an interface between the single crystal substrate 5 and the amorphous Si 45 and extends to fill the entire via 30.

Figure 6:
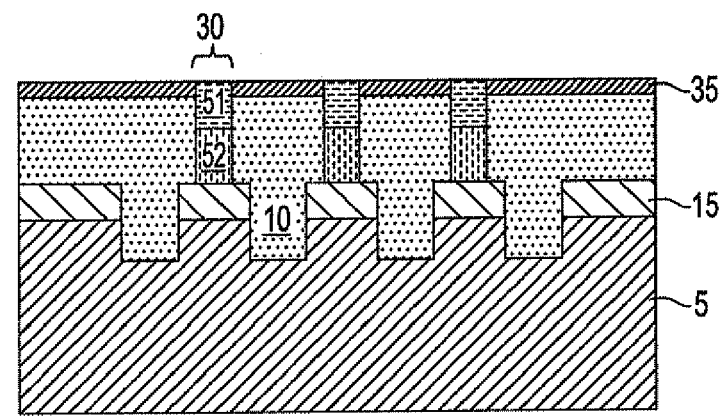
FIG. 6 is a side cross sectional view depicting the formation of the dopant regions of a PN junction in the single crystal Si, in accordance with one embodiment of the present invention.

FIG. 6 depicts one embodiment of the formation of dopant regions 51, 52 in the single crystal Si 50, in accordance with the present method. In one embodiment, the dopant regions 51, 52 may include a first dopant region 51 and a second dopant region 52, wherein the first dopant region 51 has a different electrical conductivity than the second dopant region 52. In one embodiment, the first dopant regions 51, and second dopant region 52 provide a PN junction in the single crystal Si 50. In one embodiment, the first dopant region 51 is formed abutting the second dopant region 52 along a vertical axis of the single crystal Si 50. In one embodiment, the first dopant region 51 and the second dopant region 52 may be positioned in a stacked orientation in the single crystal Si, wherein in one embodiment the second dopant 52 is positioned at a greater depth from the upper surface of the single crystal Si 50 than the first dopant region 51. The dopant regions 51, 52 may be formed by implantation of an N-type or P-type dopants in the single crystal Si 50 within the via 30. In one embodiment, the first dopant region 51 is a P-type dopant and the second dopant region 52 is an N-type dopant. In another embodiment, the second dopant region 52 is a P-type dopant and the first dopant region 51 is an N-type dopant. In one embodiment, the dopant regions 51, 52 may be formed following an etch step to recess the upper surface of the single crystal Si 50, as depicted in FIG. 7.

P-type dopants for ion implantation into the converted single crystal Si 50 may include group III-A elements, such as B. N-type dopants for ion implantation into the converted single crystal Si 50 may include group V elements, such as As or P. In one embodiment, implant conditions for a P-type dopant includes an implant energy of from about 0.5 keV to about 100 keV and a dose is from about 1E13 atoms/cm$^2$ to about 1E15 atoms/cm$^2$, wherein the dopant species may be B or BF$_2$. In one embodiment, implant conditions for an N-type dopant includes an implant energy of from about 10 keV to about 500 keV and a dose of from about 1E13 atoms/cm$^2$ to about 1E15 atoms/cm², wherein the dopant species may be P or As. In one embodiment the activation anneal is provided following the implant or is provided as part of a silicidation process.

Figure 7:
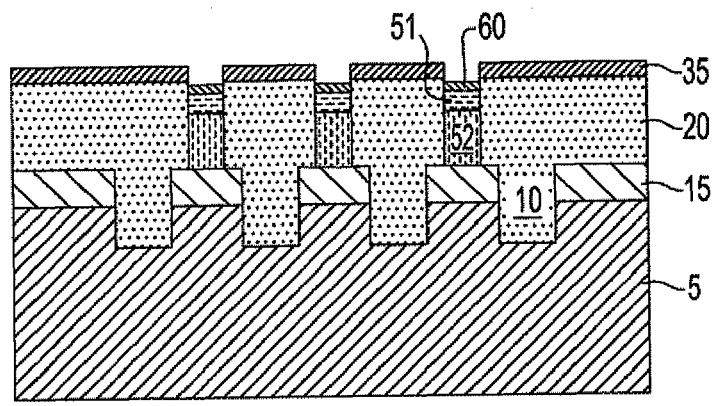
FIG. 7 is a side cross sectional view depicting the formation of a silicide atop a dopant region of PN junction, in accordance with one embodiment of the present invention.

Referring to FIG. 7, in one embodiment a suicide contact 60 may be formed atop a doped region 51 of the single crystal Si 50. In one embodiment, the upper surface of the single crystal Si 50, in which the dopant region 51 is formed, may be recessed prior to the formation of the silicide contact 60. In one embodiment, the upper surface of the single crystal Si 50 may be recessed by an etch process step, such as reactive ion etch, selective to the second insulating material 35. In one embodiment, silicide formation typically requires depositing a silicide forming metal, such as Ni or Ti, onto the upper surface of the single crystal Si 50, and annealing. During the annealing step, the deposited silicide forming metal reacts with Si forming a metal silicide. In one embodiment, annealing may include rapid thermal annealing. In one embodiment, the un-reacted silicide forming metal may be removed by a wet etch.

Figure 8:
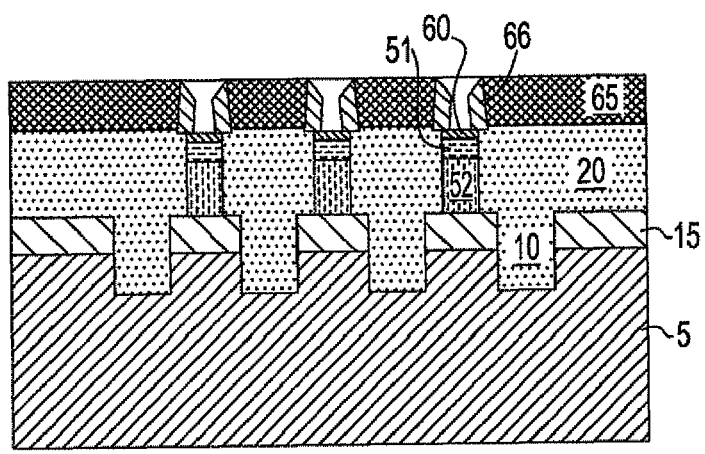
FIGS. 8 and 9 are side cross sectional views that depict embodiments of the formation of memory devices atop the PN junction, in accordance with the present invention.
Figure 9:
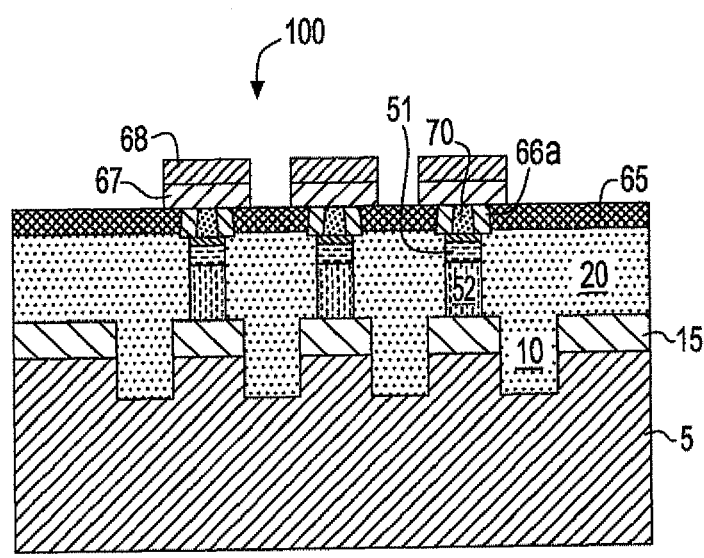

Referring to FIGS. 8 and 9, in one embodiment of the present invention, a memory cell 100 is formed atop the upper surface of the PN junction. In one embodiment, the method of forming of the memory cell 100 includes forming a phase change electrode 70 atop the silicide contact 60; and forming a phase change memory material 67 atop the phase change electrode 70.

Referring to FIG. 8, in one embodiment, forming the phase change electrode 70 includes depositing a third dielectric 65 atop the upper surface of first insulating layer 20 (or second insulating layer 35 when present); etching the third and first insulating layers 65, 20 using lithography and etch processes to provide via's exposing an upper surface of the silicide contact 60 of the doped region 51 of the single crystal Si 50; forming a spacer 66 along the via sidewall; and depositing a barrier metal atop the silicide contact 60 of the doped region.

In one embodiment, the phase change electrode 70 is composed of a barrier metal and fills the via that exposes the upper surface of the single crystal Si 50, wherein the phase change electrode 70 has a width ranging from about 2 nm to about 60 nm as defined by the dimension separating the opposing spacers 66. In one embodiment, the third dielectric layer 65 comprises an oxide and the spacer is composed of a nitride. In one embodiment, the via is formed by a photolithography and etch process. In one embodiment, the barrier metal that provides the phase change electrode 70 is formed as a layer atop the upper surface of the single crystal Si 50 using a physical deposition method, such as sputtering, or chemical vapor deposition. In one embodiment, the barrier metal that provides the phase change electrode 70 may be composed of TiN, TaN, TiSiN, TaSiN, TiAlN, TaAlN, TiW, W, Ru, or combinations thereof.

Referring to FIG. 9, in one embodiment, the phase change material 67 may be switched from an amorphous phase to a crystalline phase. When in an amorphous state, the phase change material 67 is typically less conductive than in the crystalline state. In one embodiment, the phase change material 67 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material 67 is made of any suitable material including one or more of the elements Ge, Sb, Te, Ga, In, Se, and S. In one embodiment, the phase change material 67 has a composition of $Ge_2Sb_2Te_5$ (GST).

In one embodiment, a phase change material 67 composed of GST when at a temperature of about 25° C. is in an amorphous phase. As the temperature of the GST phase change material 67 is increased to about 125° C., the resistivity of the phase change material decreases representing the transition temperature for a phase change from an amorphous phase to face center cubic (FCC) phase. Further increases in the temperature of the GST phase change material 67 to greater than about 180° C. result in further decreases in resistivity, which result from a phase change from the face centered cubic (FCC) phase to a Hexagonal (Hex) phase of the GST. When the temperature of the GST phase change material 67 is increased above the melting temperature (620° C.), the GST phase change material 67 melts and upon rapid cooling, i.e. quench, returns to the amorphous solid phase.

In one embodiment, the phase change material 67 may be blanket deposited atop the upper surface of the phase change electrode 70 by a chemical vapor deposition process. In one embodiment, the thickness of the phase change material 67 may range from about 3 to about 150 nm thickness. Thereafter, in one embodiment of the present invention a layer of barrier metal 68, such as TiN or TaN, W, TiSiN, TaSiN, TiAlN, or TaAlN is deposited atop the phase change material 67. In one embodiment, the layer of barrier metal 68 may have a thickness ranging from about 2 nm to about 100 nm. In a following process step, the barrier metal layer/phase change material stack is patterned by applying a photolithography and etch process. More specifically, in one embodiment, a pattern is produced by applying an antireflection coating and photoresist to the layer of barrier metal 68; exposing the photoresist to a pattern of radiation selected to provide at least one barrier metal layer/phase change material area corresponding to the underlying PN diodes; and then developing the pattern into the photoresist utilizing resist developer. Once the patterning of the photoresist is completed, the sections covered by the photoresist are protected, while the exposed regions are removed using a selective etching process that opens the antireflection coating and removes the unprotected regions selective to the third insulating layer 65. In one embodiment, the width of the barrier metal layer/phase change material stack is greater than the width of the phase change electrode 70.

In another embodiment, prior to the formation of the phase change material 67 a third dielectric layer 65 is deposited atop the first insulating layer 20, and is then patterned and etched to provide vias exposing an upper surface of the phase change electrode 70. In one embodiment, the width of the vias is selected to be greater than the width of the phase change electrode 70. In a following process step, a barrier metal layer/phase change material stack is formed in the via, wherein the phase change material 67 is in direct physical contact with the upper surface of the phase change electrode 70.

While the present invention has been particularly shown and described with respect to the preferred embodiments thereof it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A method of producing a PN junction comprising:
providing a single crystal substrate;
forming an insulating layer on the single crystal substrate;
forming a via through the insulating layer to provide an exposed portion of the single crystal substrate;

depositing an amorphous Si-containing material by chemical vapor deposition at a temperature of less than 500° C. on at least the exposed portion of the single crystal substrate;

forming a dielectric cap layer encapsulating the amorphous Si-containing material within the insulating layer;

converting at least a portion of the amorphous material into a single crystal material by increasing a temperature of the at least a portion of the amorphous Si-containing material by laser annealing or electron beam annealing the amorphous material through the dielectric cap layer to a temperature greater than a melting temperature of the amorphous Si-containing material and less than a melting temperature of the single crystal substrate; and forming a first dopant region abutting a second dopant region in the single crystal material after the converting of the amorphous material into the single crystal material.

2. The method of claim 1, wherein the single crystal material is single crystal Si-containing material.

3. The method of claim 2, wherein the amorphous Si-containing material comprises amorphous Si or amorphous SiGe, and the single crystal Si-containing material comprises single crystal Si or single crystal SiGe.

4. The method of claim 1, wherein the single crystal substrate comprises Si having a <100>, <111>, or <110>crystal orientation.

5. The method of claim 1, wherein the laser annealing or the electron beam annealing further comprises a single or a series of pulses of about 10 nano-seconds (ns) to about 50 nano-seconds (ns).

6. The method of claim 2, wherein the increasing of the temperature of the at least the portion of the amorphous Si-containing material comprises increasing the temperature to greater than 1150° C.

7. The method of claim 1, wherein the forming of the first dopant region in the single crystal material comprises implanting a P-type dopant and the forming of the second dopant region comprises implanting an N-type dopant.

8. The method of claim 1, further comprising forming an oxide atop the amorphous Si-containing material prior to forming the single crystal Si.

9. The method of claim 1, wherein the PN junction is integrated with resistive memories, phase change memory devices, or a combination thereof.

10. A method of producing a memory device comprising:
providing a single crystal substrate;
depositing an amorphous Si-containing material by chemical vapor deposition at a temperature of 500° C. on at least a portion of the single crystal substrate;
forming a dielectric cap layer over an entire upper surface of the amorphous Si-containing layer; converting at least a portion of the amorphous material into a single crystal material by laser annealing or electron beam annealing the amorphous material through the dielectric cap layer to increase a temperature of the at least the portion of the amorphous Si-containing material to a temperature greater than a melting temperature of the amorphous Si-containing material and less than a melting temperature of the single crystal substrate;
forming a PN junction by implanting a dopant region in the single crystal material; and
forming a memory cell in contact with the PN junction.

11. The method of claim 10, wherein the forming of the memory cell comprises:
forming a silicide contact on a dopant region of the PN junction;
forming an electrode atop the silicide contact; and
forming a phase change memory material atop the electrode.

12. The method of claim 10 further comprising forming an insulating layer on the single crystal substrate and forming a via through the insulating layer to expose the portion of single crystal substrate that the amorphous Si-containing material is present on, wherein the step of the forming of the amorphous Si-containing material substantially fills the via with the amorphous Si-containing material.

13. The method of claim 10 further comprising forming a barrier metal atop the phase change memory material and etching the barrier metal and phase change memory material to provide a barrier metal/phase change memory material stack.

14. The method of claim 13, wherein forming the electrode comprises:
recessing the single crystal Si below the upper surface of the insulating layer to expose sidewalls of the via;
forming spacers on the sidewalls of the via; and
depositing a barrier metal in the via atop the silicide contact.

* * * * *